US008363843B2

(12) United States Patent
Diedrichsen

(10) Patent No.: US 8,363,843 B2
(45) Date of Patent: Jan. 29, 2013

(54) METHODS, MODULES, AND COMPUTER-READABLE RECORDING MEDIA FOR PROVIDING A MULTI-CHANNEL CONVOLUTION REVERB

(75) Inventor: Steffan Diedrichsen, Hasloh (DE)

(73) Assignee: Apple Inc., Cupertino, CA (US)

( * ) Notice: Subject to any disclaimer, the term of this patent is extended or adjusted under 35 U.S.C. 154(b) by 1429 days.

(21) Appl. No.: 11/713,167

(22) Filed: Mar. 1, 2007

(65) Prior Publication Data

US 2009/0010460 A1 Jan. 8, 2009

(51) Int. Cl.
*H03G 3/00* (2006.01)

(52) U.S. Cl. ............. 381/63; 381/307; 381/302; 381/86

(58) Field of Classification Search .................... 381/17, 381/18, 25, 1, 24, 26, 63, 61, 62, 309, 310, 381/74, 260, 300, 21, 19, 20, 22, 23, 58, 381/59, 80, 86, 89, 332, 334, 99, 118, 119, 381/120; 708/300, 315, 322; 375/350, 232, 375/231; 379/406.11
See application file for complete search history.

(56) References Cited

U.S. PATENT DOCUMENTS

| | | | | |
|---|---|---|---|---|
| 5,544,249 | A | 8/1996 | Opitz | |
| 5,572,591 | A * | 11/1996 | Numazu et al. | 381/1 |
| 6,111,958 | A * | 8/2000 | Maher | 381/17 |
| 6,222,549 | B1 | 4/2001 | Hoddie | |
| 6,721,426 | B1 * | 4/2004 | Kurisu et al. | 381/63 |
| 7,152,082 | B2 * | 12/2006 | McGrath | 708/300 |
| 2005/0216211 | A1 * | 9/2005 | Nagatani | 702/56 |

FOREIGN PATENT DOCUMENTS

WO WO 99/49574 9/1999

OTHER PUBLICATIONS

"The IR-1, IR-L and IR-360 Parametric Convolution Reverbs", User's Guide, 2005, XP-002485972, pp. 1-40.*

Ronen Ben-Hador, et al, "Capturing Manipulation and Reproduction of Sampled Acoustic Impulse Responses", Audio Engineering Society Convention Paper, Oct. 2004, San Francisco, CA, USA, XP-002485971, pp. 1-10.*

PCT International Search Report and Written Opinion, mailing date Jul. 10, 2008 (15 pgs.). Jonathan Sheaffer et al, "Implementation of Impulse Response Measurement Techniques—An Intuitive Guide for Capturing your Own IRs". Waves Audio Ltd., Tel-Aviv, Israel, XP-002485970, Apr. 2005, (3 two-sided pages).

The IR-1, IR-L and IR-360 Parametric Convolution Reverbs, User's Guide, 2005, XP-002485972, 2005, whole document pp. 1-40, (10 two-sided pages).

Ronen Ben-Hador, et al., "Capturing Manipulation and Reproduction of Sampled Acoustic Impulse Responses", Audio Engineering Society Convention Paper. Oct. 2004, San Francisco, CA, USA, XP-002485971, pp. 1-10, (5 two-sided pages).

* cited by examiner

*Primary Examiner* — Vivian Chin
*Assistant Examiner* — Leshui Zhang
(74) *Attorney, Agent, or Firm* — Blakely, Sokoloff, Taylor & Zafman LLP

(57) ABSTRACT

The present invention provides a method of generating, on a data processing system, a multi-channel audio convolution reverb, said method comprising providing a plurality of impulse responses corresponding to a desired room to be simulated; receiving, in input, multi-channel audio sample data; performing, for each respective audio channel, same channel convolution operation on said respective audio channel with a corresponding impulse response; for each audio channel other than said respective audio channel, performing cross-channel convolution operation respectively with a corresponding cross-channel impulse response; performing combination of the results of the respective convolution operations; and outputting the combination (or summation) result as said output audio channel; wherein, in said performing said cross-channel convolution operation, wherein at least one convolution operation is performed corresponding to a shorter length of impulse response than at least one other convolution operation, preferably, said cross-channel convolution operation being performed only for an initial part of said cross-channel impulse response, said initial part being defined by a definition parameter.

13 Claims, 5 Drawing Sheets

METHODS, MODULES, AND COMPUTER-READABLE RECORDING MEDIA FOR PROVIDING A MULTI-CHANNEL CONVOLUTION REVERB

The present invention relates to methods, modules and a computer-readable recording media for providing a multi-channel convolution reverb.

TECHNICAL BACKGROUND

Recently, music projects that in former times would have required an array of professional studio equipment can now be completed in a home or project studio, using a personal computer and readily available resources. A personal computer that executes digital audio studio software such as e.g. Logic Pro 7 of Apple Computer Inc. can serve as a workstation for recording, arranging, mixing, and producing complete music projects, which can be played back on the computer, burned on a CD or DVD, or distributed over the Internet. Such audio studio software also allows to record, generate, process and output audio in surround audio formats, such as e.g. 5.1 or 7.1 surround formats, having 5 or 7 audio channels as well as optionally also an additional low frequency effects LFE channel.

Such audio studio software is also often used by musicians, professional or hobbyists, to improve studio recordings by simulating real-world spaces such as e.g. a cathedral, an opera house, or a music stage. This is often performed by using a so-called convolution reverb effect, wherein a single impulse response or a set of impulse responses of such a desired location is used. These impulse responses are also sometimes referred to as acoustic fingerprint of the location. In performing the convolution reverb effect, each channel of e.g. a surround audio track is convoluted by a corresponding impulse response, each impulse response of the set of impulse responses of the desired location to be simulated having a same length in time, respectively a same number of samples in case of the impulse responses being provided as digital sample data, e.g. of 44.1 kHz or 96 kHz sampling rate, each sample corresponding to e.g. 16 bit or 24 bit. Overall, such processing results in a number of convolution processing operations that corresponds to the number of channels in the surround audio track that are subjected to convolution reverb processing. However, such processing does not take into account that also the reverberations of the location that may be audibly perceived in one channel, but are caused by, respectively originate from an audio signal in another channel contribute to the overall spatial localisation and "spaciousness" of the resulting perception.

Recently, there have also been developed systems that offer a "true surround" convolution reverb effect, wherein each reverberated output audio channel signal respectively is the sum of each inputted audio channel signal convoluted by a corresponding impulse response. In comparison, this provides for an audio convolution reverb effect that allows for a perceivably much better simulation of an existing space, however requires a number of convolution processing operations that corresponds to the square of the number of channels in the surround audio track that are subjected to convolution reverb processing in case the number of input channels is the same as the number of output channels. Otherwise the number of required convolution processing operations corresponds to the product of the number of input channels times the number of output channels. Therefore, it will be understood by those skilled in the art that such a "true surround" convolution reverb requires a number of computations that is comparably much increased. As a result, even with recent increases in processor speed, currently available personal computers cannot perform such "true surround" convolution reverb in real-time. Instead, such effects have to be processed "off-line", requiring processing time which is usually far longer than the time of the actual surround audio file to be processed.

SUMMARY OF THE DESCRIPTION

At least certain embodiments of the present invention provide a multi-channel audio convolution reverb that provides a room simulation while being capable of being performed in real-time.

In accordance with a first embodiment of the invention, there is provided a method of generating, on a data processing system, such as a computer system, a multi-channel audio convolution reverb, comprising:

- providing a plurality of impulse responses corresponding to a desired room to be simulated;
- receiving, in input, multi-channel audio sample data;
- for each respective audio channel
  - performing same channel convolution operation on said respective audio channel with a corresponding impulse response;
  - for each audio channel other than said respective audio channel, performing cross-channel convolution operation respectively with a corresponding cross-channel impulse response;
  - performing combination, preferably summation of the results of the respective convolution operations; and
  - outputting the result of this combination or summation as said output audio channel;
- wherein at least one convolution operation is performed corresponding to a shorter length of impulse response than at least one other convolution operation.

Preferably, cross-channel convolution operation may be respectively performed only for an initial part of said cross-channel impulse response, wherein said initial part is defined by a definition parameter. The definition parameter may be fixedly predetermined, or preferably may be set by a user. Most preferably, a user may set the definition parameter according to any one of:

- time,
- number of samples of the impulse response,
- percentage of total impulse response length, or
- ratio of said initial part and total impulse response length.

Said multi-channel audio signal preferably comprises 5, 6 or 7 surround audio channels, and more preferably comprises an additional low frequency effect LFE audio channel not being subjected to convolution operation.

Further in accordance with the first embodiment of the invention, there is provided further a method of performing decorrelation operation for decorrelating said other audio channel and said respective audio channel, the decorrelated result being used in said cross-channel convolution operation (not shown).

In accordance with a first embodiment of the invention, there is also provided a machine-readable recording medium, having recorded thereon program instructions causing, when executed on a data processing system, the system to produce a multi-channel audio convolution reverb, by a method comprising:

- reading in input a plurality of impulse responses corresponding to a desired room to be simulated;
- reading, in input, multi-channel audio sample data;

for each respective audio channel performing same channel convolution operation on said respective audio channel with a corresponding impulse response;

for each audio channel other than said respective audio channel, performing cross-channel convolution operation respectively with a corresponding cross-channel impulse response;

performing combination, preferably summation of the results of the respective convolution operations; and outputting the combination respectively summation result as said output audio channel;

wherein at least one convolution operation is performed corresponding to a shorter length of impulse response than at least one other convolution operation.

Preferably, cross-channel convolution operation may be respectively performed only for an initial part of said cross-channel impulse response, said initial part being defined by a definition parameter.

Further preferably, said program instructions are realized as a software plug-in for use with an audio studio software, such as e.g. Logic Pro.

In accordance with a first embodiment of the invention, there is also provided a multi-channel audio convolution reverb module, comprising:

input means for inputting a plurality of impulse responses corresponding to a desired room to be simulated;

means for inputting multi-channel audio information;

for each audio channel, a same-channel convolution processing unit for operating a convolution process of said input audio channel with a corresponding same-channel impulse response;

a plurality of cross-channel convolution processing units for operating a convolution process respectively of other input audio channels with a corresponding cross-channel impulse response;

combination means, preferably summation means, for combining respectively adding the results of said same-channel and said cross-channel convolution processes; and outputting means for outputting the result obtained by said summation means;

at least one of said convolution processing units being adapted to perform said convolution processing only for a length of said impulse response shorter than the length being performed by at least one other of said convolution processing units.

Preferably, said cross-channel convolution processing units being adapted to perform said convolution processing only for an initial part of said cross-channel impulse response said initial part being defined by a definition parameter.

In accordance with a first embodiment of the invention, there is also provided a data carrier having stored thereon synthesized music obtained in a computer aided process involving a reverb generation operation according to the present invention.

A result of at least certain embodiments of the invention may be a data file, created through one of the methods described herein, which may be stored on a storage device of a data processing system. The data file may be an audio data file, in a digital format, which may be used to create sound by playing the data file on a system which is coupled to audio transducers, such as speakers.

One or more of the methods described herein may be implemented on a data processing system which is operable to execute those methods. The data processing system may be a general purpose or special purpose computer device, or a desktop computer, a laptop computer, a personal digital assistant, a mobile phone, an entertainment system, a music synthesizer, a multimedia device, an embedded device in a consumer electronic product, or other consumer electronic devices. In a typical embodiment, a data processing system includes one or more processors which are coupled to memory and to one or more buses. The processor(s) may also be coupled to one or more input and/or output devices through the one or more buses. Examples of data processing systems are shown and described in U.S. Pat. No. 6,222,549, which is hereby incorporated herein by reference.

The one or more methods described herein may also be implemented as a program storage medium which stores and contains executable program instructions for, when those instructions are executed on a data processing system, causing the data processing system to perform one of the methods. The program storage medium may be a hard disk drive or other magnetic storage media or a CD or other optical storage media or DRAM or flash memory or other semiconductor storage media or other storage devices.

BRIEF DESCRIPTION OF THE DRAWINGS

Further embodiments of the present invention will now be described to illustrate the above and other advantages and aspects of the invention by way of further examples and with reference to the accompanying drawings, in which.

DETAILED DESCRIPTION

Figure 1:
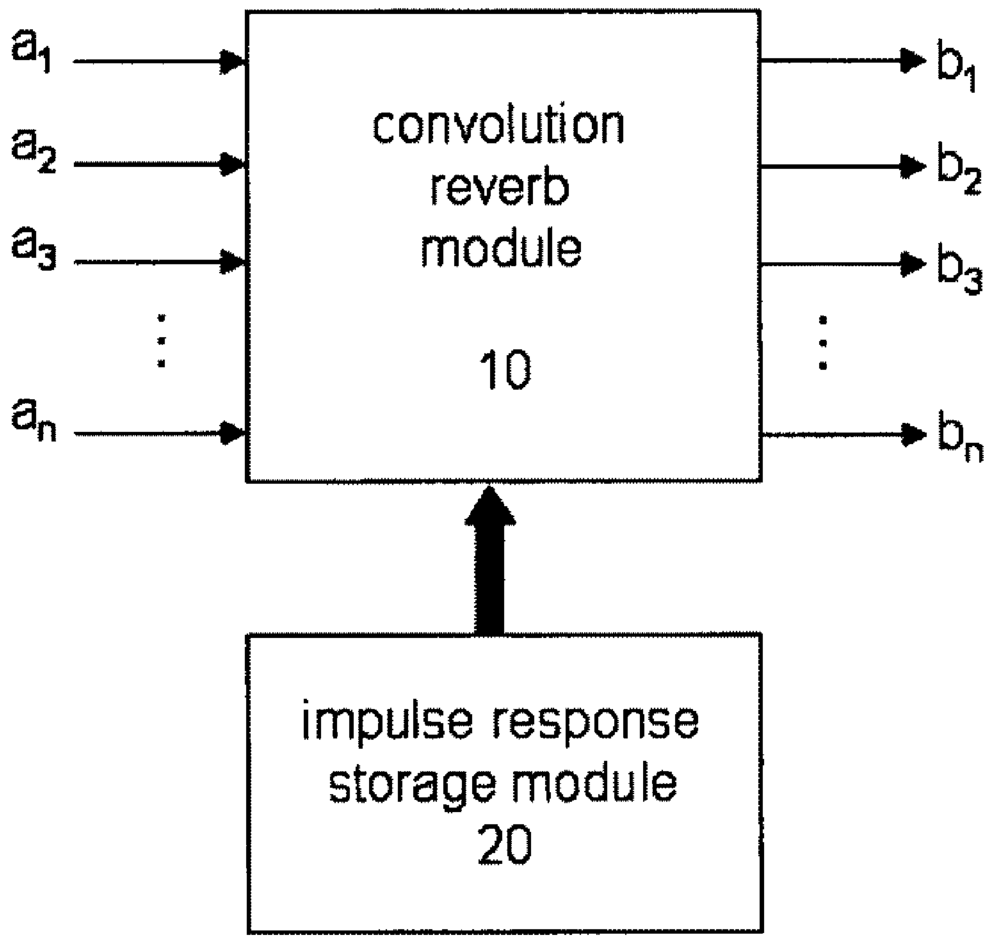
FIG. 1 shows a convolution reverb module 10 according to a first embodiment of the present invention.

FIG. 1 shows a convolution reverb module 10 which receives in input a plurality of n audio channel input signals $a_1$ to $a_n$. The audio channel input signals preferably correspond to n=5, 7 or 8 audio channels of a surround audio track. The convolution reverb module 10 also receives a plurality of impulse responses from an impulse response storage module 20 and outputs a plurality of n audio channel output signals $b_1$ to $b_n$ as a result of convolution reverb processing. Reverberation is generated by means of a real-time convolution process using a recorded impulse response, also referred to as a reverb sample. In this way, using an impulse response corresponding to a reverb recording of an actual real-world room, such as e.g. a cathedral, opera house, a realistic reverb room sound can be achieved.

An impulse response can be viewed as the total echoes of sound reflections in a given room following an initial signal spike impulse. Impulse responses are recordings made in acoustic spaces. To create an impulse response, the sound of a starter pistol, or a digital spike is recorded inside the desired room together with the resulting reflections. Alternatively, a sine sweep covering preferably the whole audible frequency range may be played back and recorded. Preferably, there is recorded, for a desired location, a plurality of impulse responses corresponding to different locations of sound sources. The impulse responses may be stored in the impulse response storage module 20 and/or utilized in the convolution reverb module 10 as computer readable files such as e.g. AIFF, SDII or WAV file formats, and may have sampling rates of e.g. 22.05 kHz, 24 kHz, 44.1 kHz, 48 kHz, 96 kHz or 192 kHz. Each sample may correspond to 16 or 24 bits.

Figure 2:
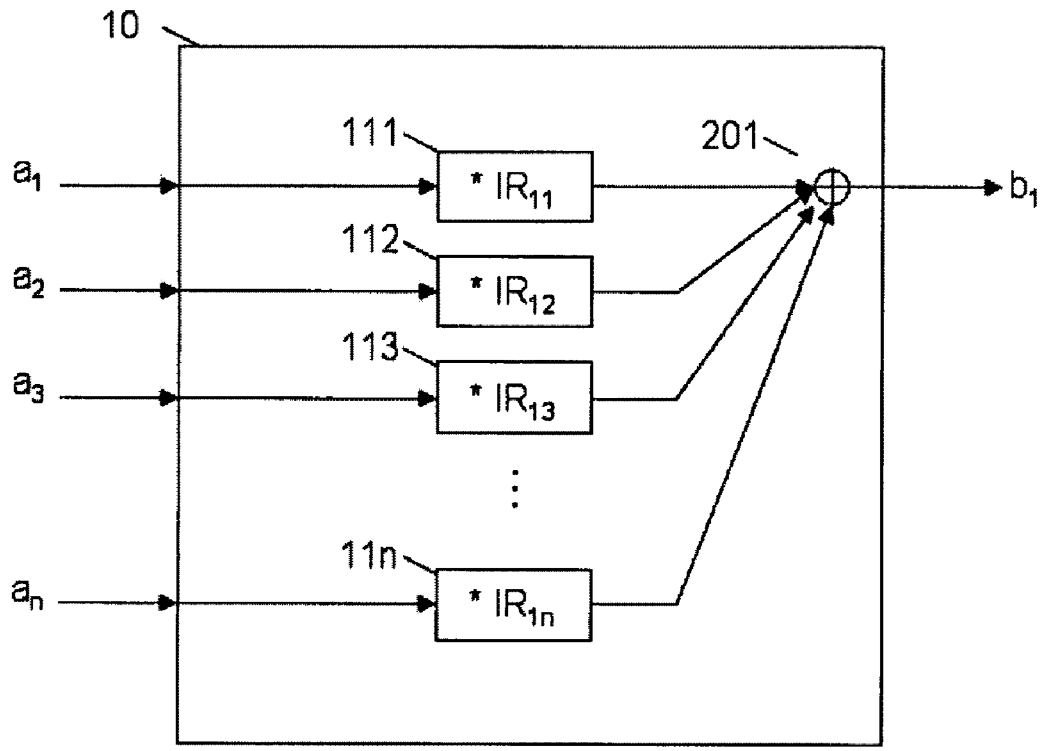
FIG. 2 shows in detail the processing for obtaining a first output audio channel signal $b_1$ in the convolution reverb module 10 of FIG. 1.

FIG. 2 shows part of the processing within the convolution reverb module 10 of FIG. 1 in more detail. In FIG. 2, it is shown how a first audio channel output signal $b_n$ is obtained as a result of convolution processing. As can be seen in FIG. 2, the convolution reverb module comprises a plurality of convolution processing units 111 to 11*n*, respectively receiving a corresponding audio channel input signal $a_1$ to $a_n$. Each convolution processing unit 111 to 11*n* performs convolution of the respectively inputted audio signal with a corresponding impulse response $IR_{11}$ to $IR_{1n}$, which have been previously obtained from said impulse response storage module 20. Preferably, the input audio signals and the impulse responses are provided in the form of digital sample data. For a given length of m samples, then, each convolution processing unit calculates a convolution result according to the following formula (1):

$$(a*IR)(n)=\sum_{k=0}^{m}a(k)IR(n-k), \tag{1}$$

wherein a(n) is the digital audio signal, and IR(n) the digital impulse response having length of m samples. Furthermore, those skilled in the art will understand that a convolution operation may not only be performed according to formula (1) as set forth in the above, but instead may also be performed by Fourier transforming the input signal and the impulse response into frequency domain, performing the point-wise product of the Fourier transformed and inversely Fourier transforming the result back into time domain. Preferably, a fast Fourier transform method is utilized in order to reduce computational load.

As can be seen in FIG. 2, in order to obtain one convolution reverb processed audio channel output signal $b_{11}$, there has to be performed a convolution processing of the same channel input signal $a_{11}$ with a corresponding same channel impulse response $IR_{11}$, as well as n−1 further cross-channel convolution processings of the n−1 other input channels with respectively corresponding cross-channel impulse responses. The result of each of these convolution processings in convolution processing units 111 to 11*n* of FIG. 2 is summed up in a summation unit 31 and outputted as said audio channel output signal $b_1$ of the first channel. Thus, the result $b_1$ can be written according to the following formula (2):

$$b_1=\sum_{p=1}^{n}(a_p*IR_{1p})(n)=\sum_{p=1}^{n}\sum_{k=0}^{m_{1p}}a_p(k)IR_{1p}(n-k), \tag{2}$$

wherein $a_p$ refers to the respective digital audio channel input signals $a_1$ to $a_n$, $IR_{1p}$ refers to the respective impulse responses, and $m_{1p}$ refers to the length as a number of samples of the impulse response over which convolution processing is performed. For a "true surround" convolution reverb effect that should provide the best possible simulation of a location, convolution processing is respectively performed over a same respective length $m_{1p}=m$.

Figure 3:
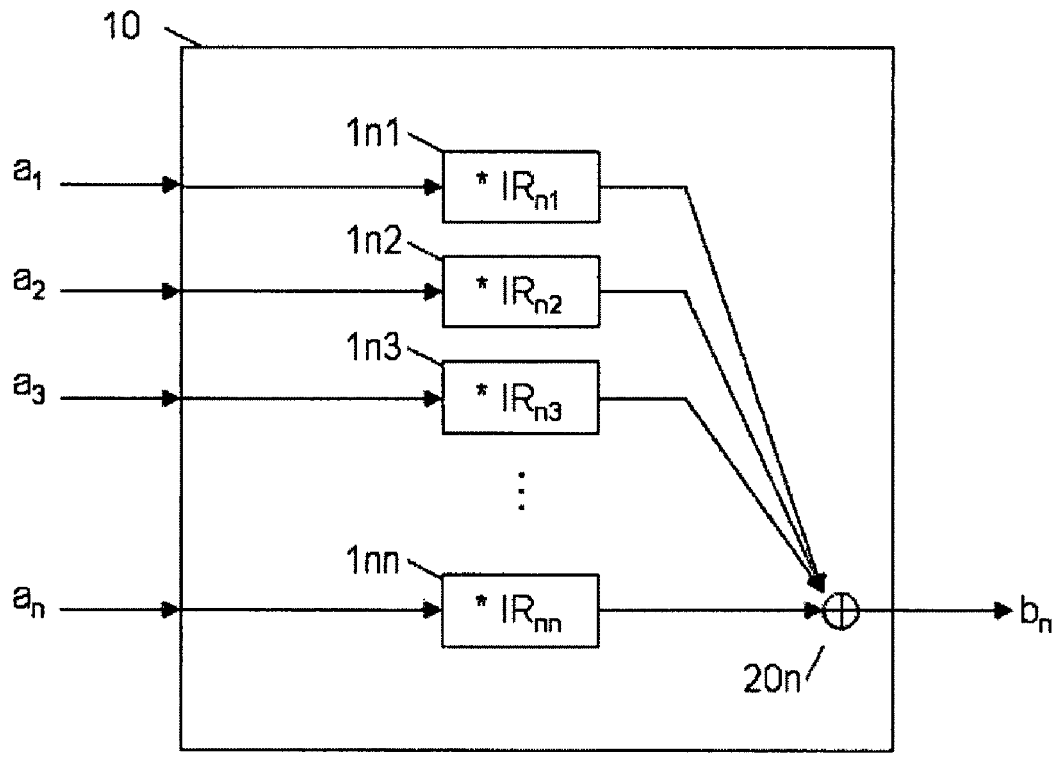
FIG. 3 shows in detail the processing for obtaining a n-th output audio channel signal $b_n$ in the convolution reverb module 10 of FIG. 1.

Referring now to FIG. 3, it will now be discussed the processing performed by the convolution reverb module for obtaining an $n^{th}$ output signal $b_n$. As can be seen in FIG. 3, similar to FIG. 2, the convolution reverb module 10 further comprises convolution processing units 1*n*1 to 1*nn*, respectively performing same channel convolution processing of input audio channel $a_n$ by same channel impulse response $IR_{nn}$ and cross-channel convolution processing of input audio channels $a_1$ to $a_{n-1}$ by corresponding cross-channel impulse responses $IR_{n1}$ to $IR_{nn-1}$. The respective results are summed up by a summation unit 30*n* in order to obtain the $n^{th}$ output channel audio signal $b_n$. Thus, $b_n$ may be written according to below formula (3):

$$b_n=\sum_{p=1}^{n}(a_p*IR_{np})(n)=\sum_{p=1}^{n}\sum_{k=0}^{m_{np}}a_p(k)IR_{np}(n-k) \tag{3}$$

As results from FIGS. 2 and 3, in order to process a multi-channel audio signal wherein n input and output channels are subjected to convolution reverb processing, it is necessary to perform a total of $n^2$ convolution operations. Otherwise the number of required convolution processing operations corresponds to the product of the number of input channels times the number of output channels.

For example, in order to simulate the reverberation of a room, such as a cathedral, opera house, or any other desired location, that has a reverberation time of e.g. 3 seconds, and using a sampling rate of 96 kHz, i.e., 96 000 samples per second, for high quality audio, then the resulting impulse responses respectively comprise 3 s×96 000 samples/s=288 000 samples. For a surround audio track of e.g. 3 min=180 s length, also sampled at 96 kHz, this results in each convolution processing requiring 288,000 sample×180 s×96,000 samples/s=4,976,640,000,000 multiplications. Assuming now a surround audio track in 7.1 surround format, having 7 audio channels that are subjected to convolution reverb processing, then a total of 7×7=49 convolution processing operations need to be performed, resulting in a total of 243,855, 360,000,000 multiplications. As will be understood by those skilled in the art, despite the advances in computer technology offering personal computers with increasingly faster microprocessors, presently available personal computer systems are not capable of performing such a large number of mathematical operations in real-time. This has the disadvantage that a user of audio studio software first has to wait for such an "off-line" convolution reverb effect to be fully calculated and the resulting convolution reverb processed multi-channel audio signal to be output and e.g. written to a hard disk of the personal computer executing the audio studio software before the user can use this resulting convolution reverb processed multi-channel audio signal for further processing, such as mixing with other audio tracks, adding further effects offered by the audio studio software and so on. As a result, the user is greatly impeded in his or her creative work flow.

According to at least certain embodiments of the present invention therefore, at least one convolution processing is limited to a part of the respective impulse response that is shorter than the one for at least one other convolution processing. More preferably, all cross-channel convolution processing is limited to an initial part of the respective cross-channel impulse responses, wherein the initial part is defined by a definition parameter. Because a natural reverb contains most of its spatial information within an initial time duration, typically the first milliseconds, whereas with increasing time, the reflection pattern becomes progressively more diffuse and indistinct, therefore, this definition parameter allows a system to capture most of the spatial information, embedded in the initial part of the impulse responses, while maintaining the overall reverberation sensation. In this way, by calculating the early reflections and the onset of the reverb using the full set of impulse responses, while towards the tail of the reverb a reduced set of impulse responses is used, the overall computational load placed upon e.g. a personal computer performing such a convolution reverb is greatly reduced. In this way, the definition parameter provides an elegant and simple means to control the balancing of reverb quality and accuracy versus requirement in processing load on the personal computer.

Figure 4:
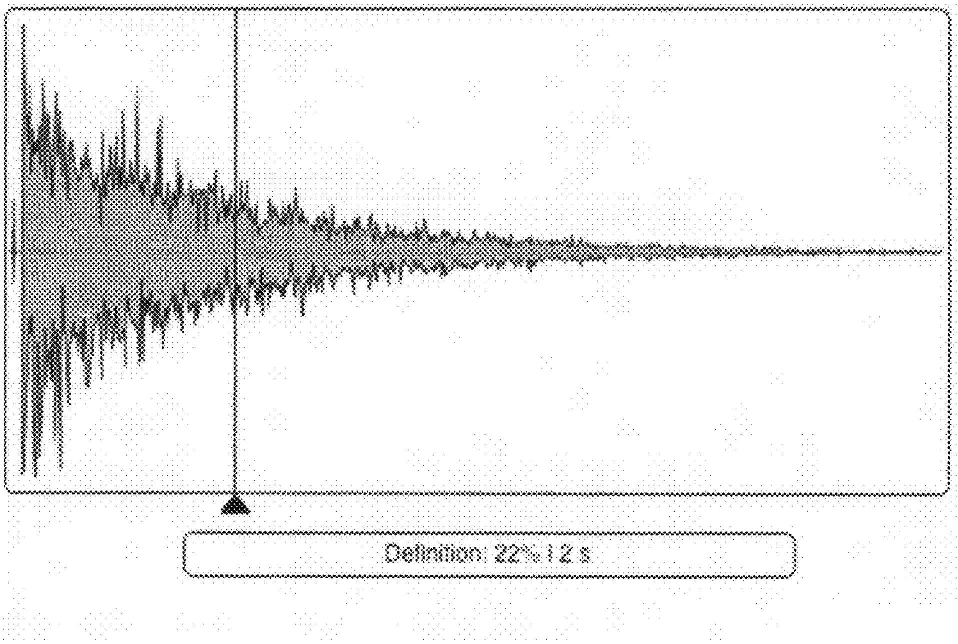
FIG. 4 shows a display screen for setting a definition parameter.

The definition parameter may be a predetermined parameter which is preferably set between 50 ms and 300 ms, more preferably between 100 ms to 200 ms. Most preferably, however, the definition parameter may be set by a user e.g. of the personal computer executing the audio studio software, such as a Macintosh computer executing Logic Pro 7 audio studio software, thus giving the user the ability to determine a suitable definition parameter. A user may set the definition parameter as a time of the initial impulse response, e.g. in milliseconds ms, or as the number of samples that the cross-channel impulse responses are taken into account and evaluated. Alternatively, a user may also set the definition parameter as a percent or as a ratio of the total length of impulse response. Most preferably, a user is offered a display screen which displays some or all of the respective impulse responses and which displays an indicator such as a vertical line corresponding to the definition parameter which is displayed on the impulse responses. By moving this vertical line, a user may visually set the definition parameter. One possible display screen, with a user interface, is shown in FIG. 4.

Accordingly, taking into account this definition parameter, an $i^{th}$ outputted audio channel signal $b_i$ is calculated as given in formula (4) below:

$$b_i = \sum_{p=1}^{n} \sum_{k=0}^{m_{ip}} a_p(k) IR_{ip}(n-k). \tag{4}$$

In this formula (4), the terms corresponding to i=p represent a same-channel convolution operation which is processed preferably according to the full length of $m_{ii}$=m samples of the same-channel impulse response $IR_{ii}$, whereas the terms corresponding to p≠q represent cross-channel convolution operation, respectively performed over a respective length $m_{ip}$. Preferably, for such cross-channel convolution, the respective length $m_{ip}$ is set according to the definition parameter only for the first v samples of the respective cross-channel impulse responses, i.e., $m_{ip}$=v for p≠q.

As will be understood by those skilled in the art, in such a way the computational load placed e.g. on a personal computer performing such a multi-channel convolution reverb may be greatly reduced. As an example, in the case of a multi-channel audio signal of a 7.1 surround audio format, subjecting seven audio channels to a "true surround" convolution reverb requires a system to perform in total 49 convolution processings over a respective impulse response length of e.g. 3 s. Setting the definition parameter to e.g. 150 ms, i.e., one twentieth of the 3 s overall impulse response length, and performing cross-channel convolution processing for cross-channel convolution operation only over the initial part of the respective impulse responses corresponding to these 150 ms, then the computational load is reduced to 7 convolution processings over 3 s length, and 42 convolution processings over 150 ms=0.15 s length. In terms of computational load, this corresponds to a load of approximately 7+42*(3 s/0.15 s)=9.1 convolution processings over a length of 3 s. As will be understood by those skilled in the art, such a multi-channel convolution reverb according to the first embodiment requires only a little additional computation when compared with a convolution reverb wherein only same-channel convolution processing is performed, and therefore is suitable also for real-time applications wherein such a convolution reverb is calculated or generated with only comparatively little or no delay upon input of the multi-channel audio signal. Therefore, a user is no longer impeded by having to wait for a convolution reverb having to be performed "off-line". The result of a method in an embodiment may be stored as audio data which can then be played back on speakers or other transducers.

Alternatively, the respective lengths $m_{pq}$ may also be set such that each respective length $m_{pq}$ is set to a different value. For example, the parameters $m_{pq}$ may be set such that for an initial length v convolution operation is performed according to the full set of impulse responses, then for a second length v' following the initial length v, convolution operation is performed for same-channel operation and additionally also in cross-channel operation for left and right front audio signal, excluding other cross-channel convolution operation, and after the second length v' only same-channel convolution operation is performed. This offers even more flexibility to a user to adjust performance of the convolution reverb module 10 according to his or her expectations and requirements. Accordingly, such increase in flexibility requires also more complexity of the settings, as now not only one definition parameter, but a plurality of different parameters has to be adjusted.

Figure 5:
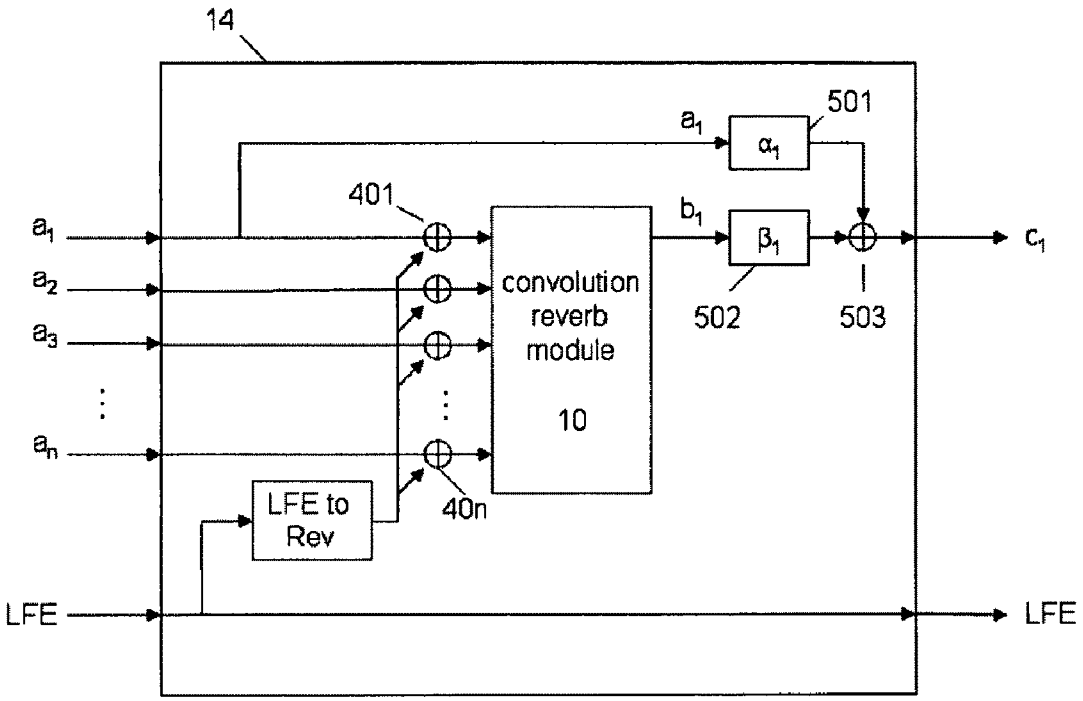
FIG. 5 shows a convolution reverb module 14 according to a second embodiment of the present invention.

Turning now to FIG. 5, a convolution reverb module 14 according to a second embodiment of the present invention will be described. The convolution reverb module 14 comprises a convolution reverb module 10 of the first embodiment, receiving in input a multi-channel audio signal comprising n audio channel signals $a_1$ to $a_n$ and an additional audio channel signal low frequency effect LFE. The multi-channel audio signal may e.g. be a 5.1 or a 7.1 surround audio signal. The convolution reverb module 14 further comprises a unit LFE to Rev, which receives the LFE signal and amplifies such according to a preferably adjustable parameter. The amplified LFE signal is added respectively to the input audio channel signals $a_1$ to $a_n$ feeding the convolution reverb module. The convolution reverb module generates respective output signals $b_1$ to $b_n$ (only b1 is shown in FIG. 5). The signal LFE is passed through without being subjected to convolution processing. However, this is not limiting and also the LFE signal may be subjected to convolution processing. Furthermore, in this embodiment, the convolution reverb module 10 produces only the "wet" reverberated signal. Therefore, corresponding to each input audio channel signal $a_1$ to $a_n$, the "dry" unreverberated signal $a_i$ is fed to a multiplication unit 501 adjusting the "dry" unreverberated audio channel signal $a_i$ in amplitude according to a parameter $\alpha_i$. Similarly, there is also provided, for each reverberated "wet" output signal $b_i$ of the convolution reverb module 10, a corresponding multiplication unit 502 adjusting the reverberated "wet" output signal $b_i$ according to a parameter $\beta_i$. A combining unit 503 combines, preferably by addition, the adjusted "dry" signal and the adjusted reverberated "wet" signal to obtain a combined output signal $c_i=\alpha_i a_i+\beta_i b_i$.

Although the above description has been made in context of multi-channel audio signals exemplified by surround audio signals having e.g. 5, 6 or 7 audio channels, this is not limiting. For example, the present invention may also be applied to a multi-channel audio signal in the form of a stereo signal having only two audio channels, left and right channel. In this case, the present invention allows a "true stereo" convolution reverb effect with reduced computational load. As a result, a user may subject a plurality of stereo signals to convolution reverb in parallel, while still being able to enjoy processing in real-time.

The present invention as described above can be implemented in numerous ways, e.g. by hardware only, by a program stored on a storage medium, etc. Such a program which enables a data processing system, such as a music machine or a music synthesizer or a computer system, to execute one or more of the above described features of the invention may comprise a screen on a display monitor which is connected to a processor which is coupled to a hard disc drive incorporating a temporary drive such as a CD-ROM, DVD, optical disc or floppy disc drive in which is inserted a suitable data storage medium. The computer system may also include a mouse and keyboard both connected electrically to the processor. Other variations of the computer system can be envisaged. For example the use of a joystick or roller ball or stylus pen and/or a plurality of temporary and hard disc drives and/or connection of the computer system to the Internet and/or other applications of the computer system in a specific application which may not include a keyboard or mouse but rather input buttons and menus on the screen.

The foregoing description has been given by way of example only and it will be appreciated by a person skilled in the art that numerous modifications can be made without departing from the scope of the present invention.

The invention claimed is:

1. A method of generating, on a computer system, a multi-channel audio convolution reverb, said method comprising:

providing a plurality of impulse responses corresponding to a desired room to be simulated;

receiving, in input, multi-channel audio sample data;

for each respective audio channel performing a same-channel convolution operation on said respective audio channel sample data with a corresponding same channel impulse response;

for audio channels other than said respective audio channel, performing a plurality of cross-channel convolution operations on said other audio channels sample data with corresponding cross-channel impulse responses respectively;

combining results of the same-channel convolution operation and the plurality of cross-channel convolution operations; and outputting a result of the combining on an output audio channel;

wherein at least one of the plurality of cross-channel convolution operations is performed over a first number of samples of a corresponding cross-channel impulse response, and the same-channel convolution operation is performed over a second number of samples of the corresponding same channel impulse response, wherein the first number is smaller than the second number.

2. The method as claimed in claim 1, wherein the first number of samples represent an initial part of said cross-channel impulse response, said initial part being defined by a definition parameter.

3. The method as claimed in claim 2, wherein for a second part following the initial part, the cross-channel convolution operations for left and right front audio signal are performed, excluding other cross-channel convolution operation.

4. The method as claimed in claim 3, wherein said multi-channel audio comprises an additional low frequency effect LFE channel, which is passed through and outputted as is, without being subjected to or partaking in convolution operation, and wherein after the second part only the same-channel convolution operation is performed.

5. The method as claimed in claim 1, wherein said multi-channel audio comprises 7 surround audio channels, or 5 surround audio channels.

6. The method as claimed in claim 2, further comprising:

setting, by a user, said definition parameter.

7. The method as claimed in claim 6, wherein the definition parameter may be set according to any one of:

time, number of samples of the impulse response, percentage of total impulse response length, or ratio of said initial part and total impulse response length.

8. The method as claimed in claim 1, further comprising performing decorrelation operation for decorrelating said other audio channel and said respective audio channel, the decorrelated result being used in said cross-channel convolution operation.

9. A non-transitory machine-readable recording medium, having recorded thereon program instructions causing, when executed on a data processing system, the data processing system to perform a method to produce a multi-channel audio convolution reverb, the method comprising:

reading in input a plurality of impulse responses corresponding to a desired room to be simulated;

reading, in input, multi-channel audio sample data;

for each respective audio channel performing a same channel convolution operation on said respective audio channel sample data with a corresponding same channel impulse response;

for audio channels other than said respective audio channel, performing a plurality of cross-channel convolution operations on said other audio channels sample data with corresponding cross-channel impulse responses respectively;

combining results of the same channel convolution operation and the plurality of cross-channel convolution operations; and outputting a result of the combining on an output audio channel;

wherein at least one of the plurality of cross-channel convolution operations is performed over a first number of samples of a corresponding cross-channel impulse response, and the same-channel convolution operation is performed over a second number of samples of the corresponding same channel impulse response, wherein the first number is smaller than the second number.

10. The non-transitory machine-readable recording medium as claimed in claim 9, wherein the first number of samples represent an initial part of said cross-channel impulse response, said initial part being defined by a definition parameter.

11. A multi-channel audio convolution reverb module, comprising:

input means for inputting a plurality of impulse responses corresponding to a desired room to be simulated;

means for inputting multi-channel audio information;

for each audio channel, a same-channel convolution processing unit for operating a convolution process of said input audio channel information with a corresponding same-channel impulse response;

a plurality of cross-channel convolution processing units for operating a plurality of cross-channel convolution processes on other input audio channels information with corresponding cross-channel impulse responses respectively, wherein at least one of the processing units comprises a processor;

combination means for combining results of said same-channel convolution process and said plurality of cross-channel convolution processes; and outputting means for outputting a result obtained by said combination means;

at least one of said plurality of cross-channel convolution processing units being adapted to perform a cross-channel convolution processing over a first number of samples of a corresponding cross-channel impulse response, and the same-channel convolution processing unit is adapted to perform a same-channel convolution processing over a second number of samples of the corresponding same channel impulse response, wherein the first number is smaller than the second number.

12. The multi-channel audio convolution reverb module of claim 11, wherein on the first number of samples represent an initial part of said cross-channel impulse response said initial part being defined by a definition parameter.

13. A system comprising:

a memory to store a synthesized music; and a processor coupled to the memory, the processor configured to provide a plurality of impulse responses corresponding to a desired room to be simulated; the processor configured to receive, in input, multi-channel audio sample data; the processor configured, for each respective audio channel, to perform a same-channel convolution operation on said respective audio channel sample data with a corresponding same channel impulse response; the processor configured, for audio channels other than said respective audio channel, to perform a plurality of cross-channel convolution operations on said other audio channels sample data with corresponding cross-channel impulse responses respectively;

the processor configured to combine results of the same-channel convolution operation and the plurality of cross-channel convolution operations; and the processor configured to output a result of the combining on an output audio channel, wherein at least one of the plurality of cross-channel convolution operations is performed over a first number of samples of a corresponding cross-channel impulse response, and the same-channel convolution operation is performed over a second number of samples of the corresponding same channel impulse response, wherein the first number is smaller than the second number.

* * * * *